(12) United States Patent
Monma (10) Patent No.: US 10,262,962 B2
(45) Date of Patent: Apr. 16, 2019

(54) SEMICONDUCTOR DEVICE

(71) Applicant: Toshiba Memory Corporation, Tokyo (JP)

(72) Inventor: Yoshihiro Monma, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/244,699

(22) Filed: Aug. 23, 2016

(65) Prior Publication Data

US 2017/0069588 A1    Mar. 9, 2017

(30) Foreign Application Priority Data

Sep. 3, 2015  (JP) ................... 2015-173747

(51) Int. Cl.
*H01L 23/00*    (2006.01)
*H01L 23/544*   (2006.01)
(Continued)

(52) U.S. Cl.
CPC .............. *H01L 24/09* (2013.01); *H01L 21/56* (2013.01); *H01L 22/32* (2013.01); *H01L 23/544* (2013.01); *H01L 24/49* (2013.01); *H01L 24/85* (2013.01); *H01L 25/0657* (2013.01); *H01L 24/48* (2013.01); *H01L 2224/04042* (2013.01); *H01L 2224/06153* (2013.01); *H01L 2224/06155* (2013.01); *H01L 2224/48145* (2013.01);
(Continued)

(58) Field of Classification Search
CPC ..... H01L 25/0657; H01L 24/09; H01L 24/49; H01L 23/544; H01L 21/56; H01L 22/32; H01L 24/85; H01L 2224/04042; H01L 2224/09132
See application file for complete search history.

(56) References Cited

U.S. PATENT DOCUMENTS 6,621,169 B2   9/2003  Kikuma et al.
6,777,799 B2   8/2004  Kikuma et al.
(Continued)

FOREIGN PATENT DOCUMENTS

JP    2-273930       11/1990
JP    H04-199566 A    7/1992
(Continued)

OTHER PUBLICATIONS

Japanese Office Action dated Mar. 27, 2018 filed in counterpart Japanese Patent Application No. 2015-173747 (12 pages) (with machine translation).
(Continued)

*Primary Examiner* — A. Sefer
(74) *Attorney, Agent, or Firm* — Kim & Stweart LLP (57) ABSTRACT

A semiconductor device includes a terminal, a first semiconductor chip, a second semiconductor chip located on the first semiconductor chip, a first pad located on the first semiconductor chip and electrically disconnected from a semiconductor circuit of the first semiconductor chip, a second pad located on the second semiconductor chip and electrically connected to a semiconductor circuit of the second semiconductor chip, a first wire electrically connecting the first terminal to the first pad, and a second wire electrically connecting the first pad to the second pad.

14 Claims, 5 Drawing Sheets

(51) Int. Cl.
*H01L 21/56* (2006.01)
*H01L 21/66* (2006.01)
*H01L 25/065* (2006.01)

(52) U.S. Cl.
CPC ............... *H01L 2224/48247* (2013.01); *H01L 2225/06562* (2013.01); *H01L 2225/06565* (2013.01); *H01L 2225/1052* (2013.01); *H01L 2924/00014* (2013.01)

(56) References Cited

U.S. PATENT DOCUMENTS

| | | | |
|---|---|---|---|
| 6,798,071 B2 | 9/2004 | Kawaishi | |
| 7,981,788 B2 | 7/2011 | Muto et al. | |
| 2008/0088005 A1* | 4/2008 | Iwata | H01L 23/13 257/690 |
| 2010/0148172 A1* | 6/2010 | Watanabe | H01L 21/6836 257/48 |
| 2011/0269268 A1* | 11/2011 | Muto | H01L 24/48 438/107 |
| 2012/0056178 A1* | 3/2012 | Han | H01L 22/32 257/48 |
| 2012/0080806 A1* | 4/2012 | Song | H01L 22/32 257/777 |
| 2012/0133055 A1* | 5/2012 | Machida | H01L 24/06 257/777 |
| 2015/0302900 A1* | 10/2015 | Lee | G11C 5/025 365/51 |
| 2016/0079139 A1* | 3/2016 | Kaeriyama | H01L 24/49 257/48 |
| 2016/0181214 A1* | 6/2016 | Oh | G11C 7/1078 257/777 |

FOREIGN PATENT DOCUMENTS

| | | |
|---|---|---|
| JP | 2001-177050 A | 6/2001 |
| JP | 2002-026239 A | 1/2002 |
| JP | 2002-151644 A | 5/2002 |
| JP | 2003-023135 A | 1/2003 |
| JP | 2007-019415 A | 1/2007 |
| JP | 2008147506 A * | 6/2008 |

OTHER PUBLICATIONS

Japanese Office Action dated Oct. 30, 2018, filed in counterpart Japanese Patent Application No. 2015-173747, 13 pages (with English translation).

* cited by examiner

SEMICONDUCTOR DEVICE

CROSS-REFERENCE TO RELATED APPLICATION

This application is based upon and claims the benefit of priority from Japanese Patent Application No. 2015-173747, filed on Sep. 3, 2015, the entire contents of which are incorporated herein by reference.

FIELD

Embodiments described herein relate generally to a semiconductor device including semiconductor chips which are stacked.

BACKGROUND

A semiconductor device is known in which multiple semiconductor chips (or semiconductor elements) are stacked in multiple stages.

DETAILED DESCRIPTION

Embodiments provide a semiconductor device which has reduced abnormalities in connections made by a bonding wire between a lead terminal and a pad of a semiconductor chip stacked thereon.

In general, according to one embodiment, a semiconductor device includes a first terminal, a first semiconductor chip, a second semiconductor chip located on the first semiconductor chip, a first pad located on the first semiconductor chip and electrically disconnected from a semiconductor circuit of the first semiconductor chip, a second pad located on the second semiconductor chip and electrically connected to a semiconductor circuit of the second semiconductor chip, a first wire electrically connecting the first terminal to the first pad, and a second wire electrically connecting the first pad to the second pad.

Hereinafter, embodiments will be described with reference to the drawings. In the following description, the same reference numerals or symbols will be given to elements having the same function and configuration.

1. First Embodiment
1.1 Circuit Configuration of Semiconductor Device

A circuit configuration of a semiconductor device according to a first embodiment will be described with reference to FIG. 1.

Figure 1:
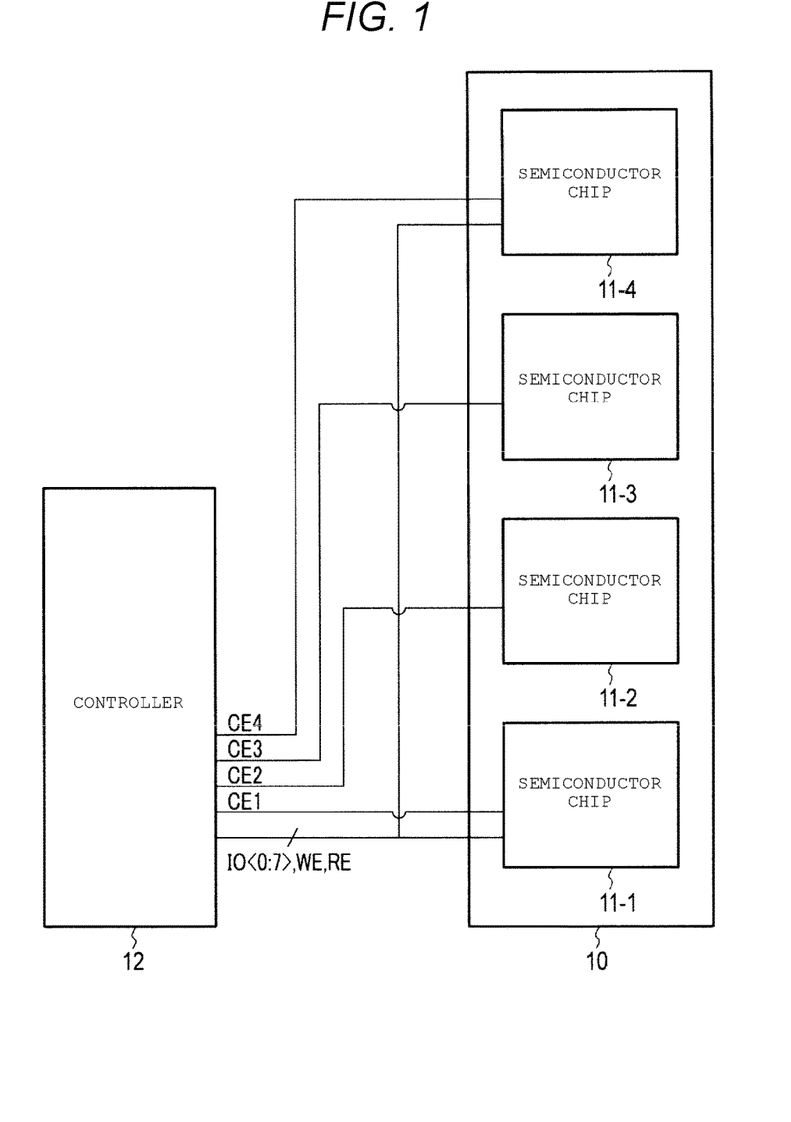
FIG. 1 is a diagram illustrating a circuit configuration of a semiconductor device according to a first embodiment.

As illustrated in FIG. 1, a semiconductor device 10 includes, for example, multiple semiconductor chips (or semiconductor elements) 11_1, 11_2, 11_3, and 11_4. Each of the semiconductor chips 11_1 to 11_4 includes a semiconductor substrate in which a semiconductor circuit, for example, a memory circuit, various drivers, an input and output circuit, and the like are formed. Here, a case in which the semiconductor device 10 includes four semiconductor chips is illustrated, but the semiconductor device 10 may also include five or more semiconductor chips. A semiconductor chip 11 indicates each of the four semiconductor chips 11_1 to 11_4.

A controller 12 is connected to each of the semiconductor chips 11_1 to 11_4. The controller 12 controls each of the semiconductor chips 11_1 to 11_4. The controller 12 outputs a chip enable signal CE1 to the semiconductor chip 11_1. Furthermore, the controller 12 respectively outputs the chip enable signal CE2 to the semiconductor chip 11_2, the chip enable signal CE3 to the semiconductor chip 11_3, and the chip enable signal CE4 to the semiconductor chip 11_4.

The chip enable signal CE1 selects the semiconductor chip 11_1 to be in an operable state, or to be in an inoperable state. The chip enable signal CE2 selects the semiconductor chip 11_2 to be in an operable state, or to be in an inoperable state. The chip enable signal CE3 selects the semiconductor chip 11_3 to be in an operable state, or to be in an inoperable state. The chip enable signal CE4 selects the semiconductor chip 11_4 to be in an operable state, or to be in an inoperable state.

In addition, the controller 12 outputs input and output signals IO0, IO1, IO2, IO3, IO4, IO5, IO6, and IO7 to each of the semiconductor chips 11_1 to 11_4. In addition, the controller 12 outputs other signals including a write enable signal WE and a read enable signal RE to each of the semiconductor chips 11_1 to 11_4.

1.2 Structure of Semiconductor Device

A structure of the semiconductor device according to the first embodiment will be described.

1.2.1 Stacking Structure of Semiconductor Chips

Figure 2:
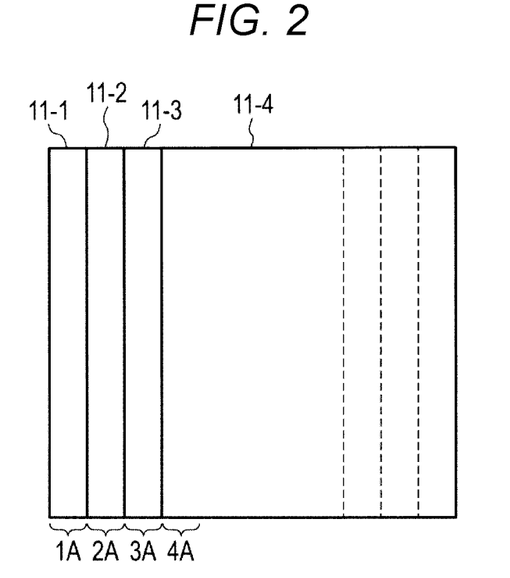
FIG. 2 is a diagram illustrating a structure of a semiconductor chip in the semiconductor device according to the first embodiment.

A stacking structure of semiconductor chips in the semiconductor device 10 will be described with reference to FIG. 2.

Each of the semiconductor chips 11_1 to 11_4 has a rectangular shape. A pad area 1A in which pads are arranged is arranged on a long side of the rectangular shape of the semiconductor chip 11_1. Similarly, a pad area 2A in which pads are arranged is arranged on a long side of the rectangular shape of the semiconductor chip 11_2. A pad area 3A in which pads are arranged is arranged on a long side of the rectangular shape of the semiconductor chip 11_3, and a pad area 4A in which pads are arranged is arranged on a long side of the rectangular shape of the semiconductor chip 11_4.

Semiconductor chips 11_2, 11_3, and 11_4 are sequentially stacked on the semiconductor chip 11_1. The semiconductor chip 11_2 is arranged on the semiconductor chip 11_1 so as to be shifted by the pad area 1A of the semiconductor chip 11_1. The semiconductor chip 11_3 is arranged on the semiconductor chip 11_2 so as to be shifted by the pad area 2A of the semiconductor chip 11_2. Furthermore, the semiconductor chip 11_4 is arranged on the semiconductor chip 11_3 so as to be shifted by the pad area 3A of the semiconductor chip 11_3.

1.2.2 Another Stacking Structure of Semiconductor Chips

Another stacking structure of semiconductor chips will be described with reference to FIG. 3.

The pad area 1A is arranged on a short side of the rectangular shape of the semiconductor chip 11_1. The pad area 3A is arranged on a short side of the rectangular shape of the semiconductor chip 11_3. In addition, the pad area 2A is arranged on a long side of the rectangular shape of the semiconductor chip 11_2. The pad area 4A is arranged on a long side of the rectangular shape of the semiconductor chip 11_4.

The semiconductor chip 11_2 is arranged on the semiconductor chip 11_1 so as to be shifted by the pad area 1A of the semiconductor chip 11_1. The semiconductor chip 11_3 is arranged on the semiconductor chip 11_2 so as to be shifted by the pad area 2A of the semiconductor chip 11_2. Furthermore, the semiconductor chip 11_4 is arranged on the semiconductor chip 11_3 so as to be shifted by the pad area 3A of the semiconductor chip 11_3.

Figure 3:
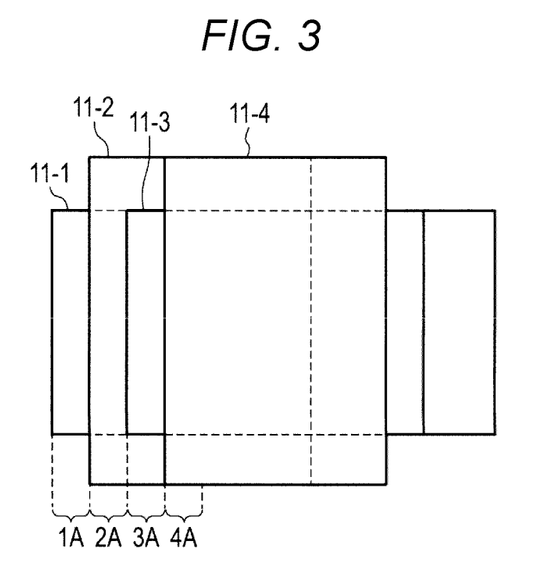
FIG. 3 is a diagram illustrating another structure of the semiconductor chip in the semiconductor device according to the first embodiment.

That is, as illustrated in FIG. 3, the pad area 2A on the long side of the semiconductor chip 11_2 is arranged so as to correspond to the pad area 1A on the short side of the semiconductor chip 11_1. Furthermore, the pad area 3A on the short side of the semiconductor chip 11_3 is arranged so as to correspond to the pad area 2A of the semiconductor chip 11_2, and the pad area 4A on the long side of the semiconductor chip 11_4 is arranged so as to correspond to the pad area 3A of the semiconductor chip 11_3.

1.2.3 Configuration of Pad of Semiconductor Chip

A configuration of pads of semiconductor chips illustrated in FIG. 2 and FIG. 3 will be described with reference to FIG. 4.

The pad area 1A of the semiconductor chip 11_1 includes two columns in which pads are arranged. A signal pad 1S is arranged in a column (first column) on a chip center side of the edge of the semiconductor chip 11_1. The signal pad 1S is a pad which a signal is input to and output from, is a pad which is electrically connected to the semiconductor chip 11_1, and which is in a state of an electrical connection with a semiconductor circuit of semiconductor chip 11-1. For example, the chip enable signal CE1, the write enable signal WE, the read enable signal RE, or the input and output signals IO0 to IO7 are input to and output from to the signal pad 1S. In addition, a dummy pad 1D is arranged in a column (second column) on an end portion side of the semiconductor chip 11_1. The dummy pad 1D is arranged in a scribe area which will be described below, is not electrically connected to a semiconductor circuit of, for example, the semiconductor chip 11_1, and is thus in a state of electrical disconnection.

In the same manner, the pad area 2A of the semiconductor chip 11_2 includes two columns in which pads are arranged. A signal pad 2S is arranged in a column on a chip center side of the edge of the semiconductor chip 11_2. The signal pad 2S is a pad which a signal is input to and output from, is electrically connected to the semiconductor chip 11-2 of the semiconductor chip 11_2, and is in a state of an electrical connection with a semiconductor circuit of semiconductor chip 11-2. For example, the chip enable signal CE2, the write enable signal WE, the read enable signal RE, or the input and output signals IO0 to IO7 are input to and output from to the signal pad 2S. A dummy pad 2D is arranged in a column on an end portion side of the semiconductor chip 11_2. The dummy pad 2D is arranged in the scribe area, is not electrically connected to a semiconductor circuit of, for example, the semiconductor chip 11_2, and is thus in a state of electrical disconnection.

The pad area 3A of the semiconductor chip 11_3 includes two columns in which pads are arranged. A signal pad 3S is arranged in a column on a chip center side of the edge of the semiconductor chip 11_3. The signal pad 3S is a pad to which a signal is input and from which a signal is output, is electrically connected to the semiconductor chip 11_3, and which is in a state of an electrical connection with a semiconductor circuit of semiconductor chip 11-3. For example, the chip enable signal CE3, the write enable signal WE, the read enable signal RE, or the input and output signals IO0 to IO7 are input to and output from the signal pad 3S. A dummy pad 3D is arranged in a column on an end portion side of the semiconductor chip 11_3. The dummy pad 3D is arranged in a scribe area, is not electrically connected to a semiconductor circuit of, for example, the semiconductor chip 11_3, and is thus in a state of electrical disconnection.

The pad area 4A of the semiconductor chip 11_4 includes two columns in which pads are arranged. A signal pad 4S is arranged in a column on a chip center side of the edge of the semiconductor chip 11_4. The signal pad 4S is a pad which a signal is input to and output from, is electrically connected to the semiconductor chip 11_4, and is in a state of an electrical connection with a semiconductor circuit of chip 11_4. For example, the chip enable signal CE4, the write enable signal WE, the read enable signal RE, or the input and output signals IO0 to IO7 are input to and output from the signal pad 4S. A dummy pad 4D is arranged in a column on an end portion side of the semiconductor chip 11_4. The dummy pad 4D is arranged in a scribe area, is not electrically connected to a semiconductor circuit of, for example, the semiconductor chip 11_4, and is thus in a state of electrical disconnection.

Figure 4:
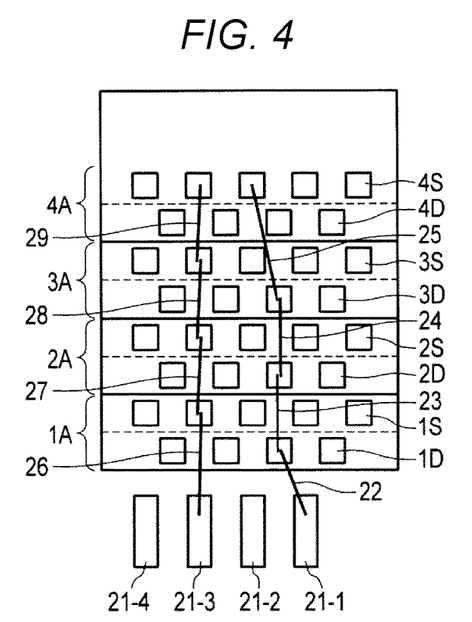
FIG. 4 is an enlarged diagram of a terminal section of the semiconductor chip according to the first embodiment.

In addition, as illustrated in FIG. 4, multiple lead terminals for an electrical connection to the outside are arranged on an outer side of the pad area 1A of the semiconductor chip 11_1. Here, four lead terminals 21_1, 21_2, 21_3, and 21_4 are illustrated. Wires 22 to 29 are connected between the lead terminals and the pads, or between the pads. The connections made by the wires will be described below.

1.2.4 Connection Between Pad of Semiconductor Chip and Lead Terminal

Connections by wires between pads of the semiconductor chip 11_and lead terminals will be described with reference to FIG. 4.

First, an example in which a connection between the lead terminal 21_1 and the signal pad 4S by a wire will be described. For example, the chip enable signal CE4 is transferred from the lead terminal 21_1 to the signal pad 4S.

A wire 22 is bonded to, and connects between, the lead terminal 21_1 and the dummy pad 1D. As a result, the lead terminal 21_1 is electrically connected to the dummy pad 1D. Furthermore, a wire 23 is bonded to, and connects between, the dummy pad 1D and the dummy pad 2D, and the dummy pad 1D is electrically connected to the dummy pad 2D. A wire 24 is bonded to, and connects between, the dummy pad 2D and the dummy pad 3D, and the dummy pad 2D is electrically connected to the dummy pad 3D. Furthermore, a wire 25 is bonded to, and connects between, the dummy pad 3D and the signal pad 4S, and the dummy pad 3D is electrically connected to the signal pad 4S.

For example, the chip enable signal CE4 is supplied to the lead terminal 21_1 from the controller 12. The chip enable signal CE4 is transferred to the signal pad 4S from the lead terminal 21_1 through the wire 22, the dummy pad 1D, the wire 23, the dummy pad 2D, the wire 24, the dummy pad 3D, and the wire 25.

Here, the wires are connected to the signal pad 4S from the lead terminal 21_1 through the dummy pads 1D, 2D, and 3D. That is, in order to connect a wire between the lead terminal 21_1 and the signal pad 4S, the dummy pads 1D, 2D, and 3D are used as relay pads for connections by wires. As a result, it is possible to reduce a length of each of the wires 22 to 25, compared to a case where the lead terminal 21_1 is directly connected to the signal pad 4S by a wire. As a result, it is possible to reduce abnormalities in which a wire is deformed due to moving to the left and right, or a wire is disconnected from a lead terminal or a pad.

Next, an example in which a wire is connected between the lead terminal 21_3 and signal pads 1S to 4S will be described. In this example, for example, the input signal IO0 is transferred to each of the signal pads 1S to 4S from the lead terminal 21_3.

A wire 26 is bonded to, and between, the lead terminal 21_3 and the signal pad 1S. As a result, the lead terminal 21_3 is electrically connected to the signal pad 1S. Furthermore, a wire 27 is bonded to, and between, the signal pad 1S and the signal pad 2S, and the signal pad 1S is electrically connected to the signal pad 2S. A wire 28 is bonded to, and between, the signal pad 2S and the signal pad 3S, and the signal pad 2S is electrically connected to the signal pad 3S. Furthermore, a wire 29 is bonded to, and between, the signal pad 3S and the signal pad 4S, and the signal pad 3S is electrically connected to the signal pad 4S.

For example, the input and output signal IO0 is supplied to the lead terminal 21_3 from the controller 12. The input and output signal IO0 is transferred to the signal pad 1S from the lead terminal 21_3 through the wire 26. Furthermore, the input and output signal IO0 is transferred to the signal pad 2S through the wire 27. Furthermore, the input and output signal IO0 is transferred to the signal pad 3S through the wire 28 and is transferred to the signal pad 4S through the wire 29.

Here, in order to connect between the lead terminal 21_3 and each of the signal pads 1S to 4S using wires, wires are sequentially connected between the lead terminal 21_3 and the signal pad 1S, between the signal pad 1S and the signal pad 2S, between the signal pad 2S and the signal pad 3S, and the signal pad 3S and the signal pad 4S. For this reason, wires which are connected between the lead terminal 21_3 and a signal pad, and between signal pads are not lengthened, and abnormalities in connections by wires is suppressed.

1.3 Manufacturing Method of Semiconductor Device

A fabrication method of the semiconductor chip 11_in the semiconductor device 10 will be described with reference to FIGS. 5, 6, and 7.

Figure 5:
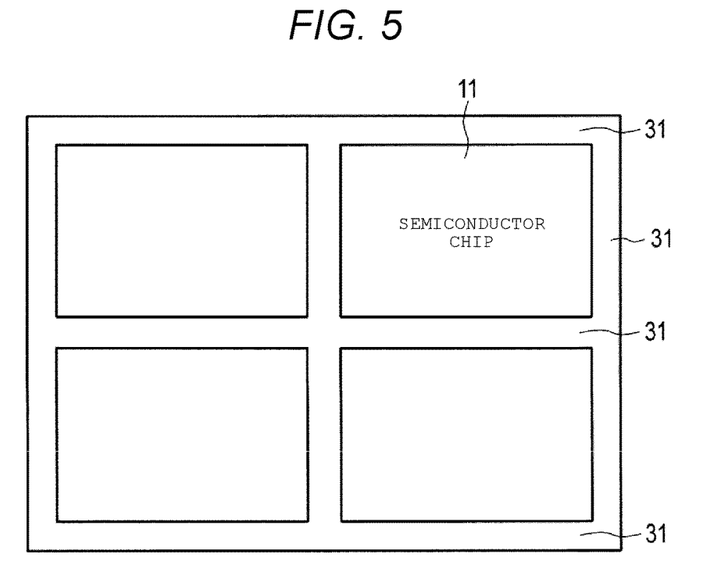
FIG. 5 is a diagram illustrating a fabrication process of the semiconductor chip according to the first embodiment.

FIG. 5 illustrates an enlarged diagram of a portion of the semiconductor chips 11_whose layout is made on a wafer. Layout of the semiconductor chips 11_is made on a wafer. Scribe areas (Kerf area) 31 are provided between semiconductor chips 11_so as to separate the semiconductor chips.

Figure 6:
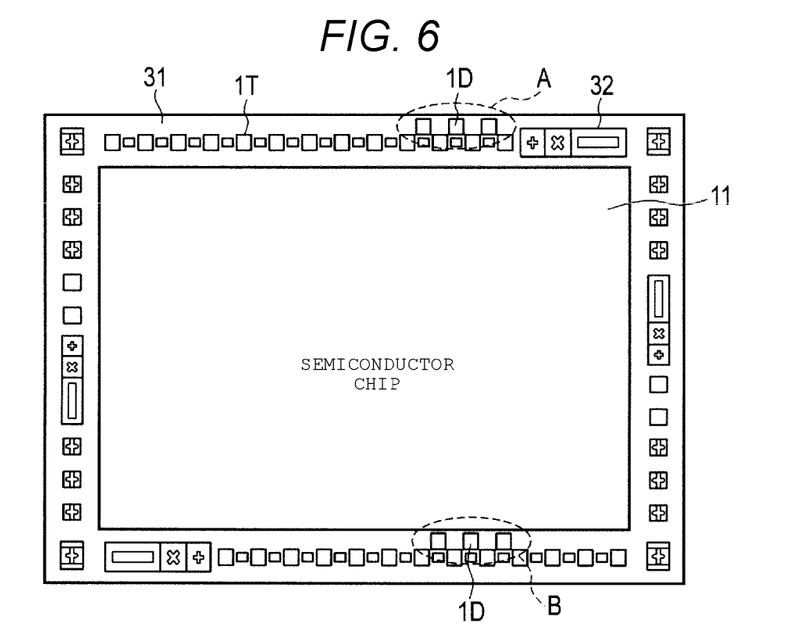
FIG. 6 is an enlarged diagram of the semiconductor chip illustrated in FIG. 5.

FIG. 6 illustrates an enlarged diagram of the semiconductor chip 11. A memory circuit, various drivers, an input and output circuit, and the like are formed in a central area of the semiconductor chip 11. Positioning marks 32 for photolithography, pads 1T (or 2T, 3T, or 4T) of a test element group (TEG) element, and dummy pads 1D (or 2D, 3D, or 4D) are arranged in the scribe areas 31. The TEG element indicates a test element for assessing elements formed on the semiconductor chip. The dummy pad 1D within a dashed line A is arranged on an end portion side rather than a pad of the TEG element. The dummy pad 1D in a dashed line B is arranged on a central area side rather than the pad of the TEG element.

Figure 7:
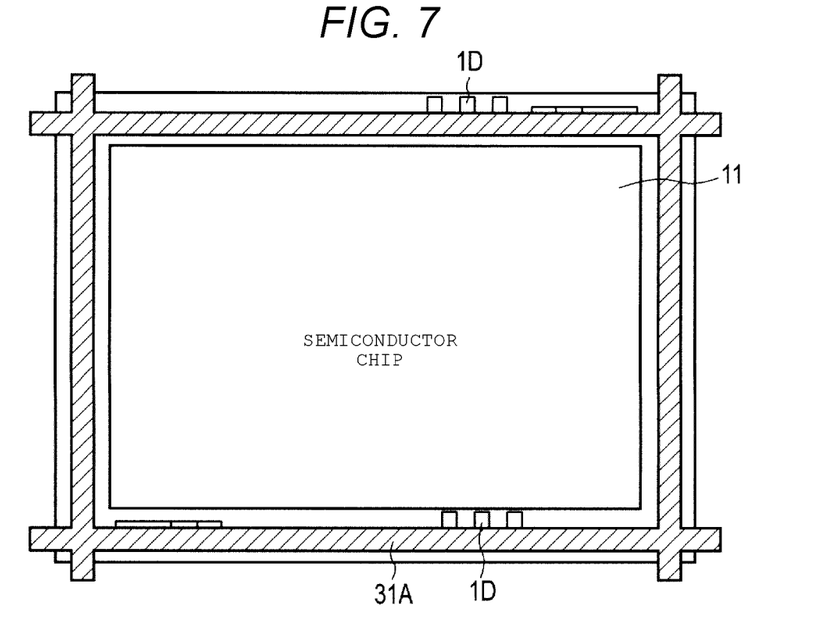
FIG. 7 is a diagram illustrating a scribe position of the semiconductor chip illustrated in FIG. 6.

In a scribe process, the semiconductor chips 11_are separated by shifting a scribe area 31A such that the dummy pad 1D provided in the scribe areas 31 remains on the semiconductor chip 11, as illustrated in FIG. 7. As a result, portions of the scribe areas 31 on which the dummy pads 1D are arranged can remain on the semiconductor chip 11.

Thereafter, the semiconductor chips 11_are stacked, and thus the semiconductor chips which are stacked in multiple stages are formed. Furthermore, wire bonding is performed between lead terminals and pads of the semiconductor chip, and the semiconductor chips are sealed with a resin, and thus the semiconductor device (package) 10 is formed.

1.4 Effects of First Embodiment

According to the first embodiment, it is possible to provide a semiconductor device which has reduced abnormalities in connections made by wire bonding between pads of stacked semiconductor chips and lead terminals. Furthermore, relay pads for connecting bonding wires are arranged in scribe areas, and thus it is possible to prevent an area of a semiconductor chip from increasing.

Hereinafter, the effects of the first embodiment will be described in detail using a comparison example.

For example, in a semiconductor device in which semiconductor chips are stacked in multiple stages, wires are required to be connected from the lead terminals or other external connections directly to the pads provided in each semiconductor chip, if wires are connected to the second or the next semiconductor chips from lead terminals. In this case, bonding wires are lengthened, and movement or disconnection of the wires easily occur during sealing with resin. Furthermore, if large scaling or large capacity of circuits is required, the number of stages of semiconductor chips which are stacked is increased, and thus a length of the wire is further lengthened, and there is a high possibility that movement or disconnection of the wire occurs.

For this reason, for example, dummy pads are arranged in an area in which signal pads of a semiconductor chip are arranged, the dummy pads are used as relay pads for connecting bonding wires, and thus it is possible to prevent the bonding wires from being lengthened. However, if the semiconductor chip is miniaturized and an area of the semiconductor chip is reduced, surplus pads are with difficulty arranged in the semiconductor chip. That is, if the semiconductor chip is miniaturized, dummy pads are with difficulty arranged in the area in which the signal pads are arranged due to limitation of a chip size.

Hence, in the first embodiment, dummy pads are formed in a scribe area in the outside of an area in which signal pads of a semiconductor chip are arranged. Thus, the dummy pads formed in the scribe area are used as relay pads for connecting the bonding wires. That is, when a wire is connected to a pad of a connection target, the wire is not directly connected to the pad of the connection target from a lead terminal of a package substrate, the wire is first connected to the dummy pad of the scribe area from the lead terminal, and next, the wire is connected to the pad of the connection target from the dummy pad. A connection between the lead terminal and the pad of the connection target may be made through multiple dummy pads. As a result, it is possible to prevent the bonding wire from being lengthened, and to reduce abnormalities in which a wire is deformed due to movement to the left and right when sealing with a resin, or a wire is disconnected from a lead terminal or a pad.

Furthermore, it is possible to prevent a size of an area in which signal pads are arranged from increasing, by forming the dummy pads in the scribe area in the outside of an area in which the signal pads are arranged. As a result, it is possible to prevent a size of a semiconductor chip and a semiconductor device from increasing.

2. Second Embodiment

In a second embodiment, pads of a TEG element provided in a scribe area are used as relay pads for connecting bonding wires. In the second embodiment, points different from those in the first embodiment will be described.

2.1 Configuration of Pads of Semiconductor Chip

Figure 8:
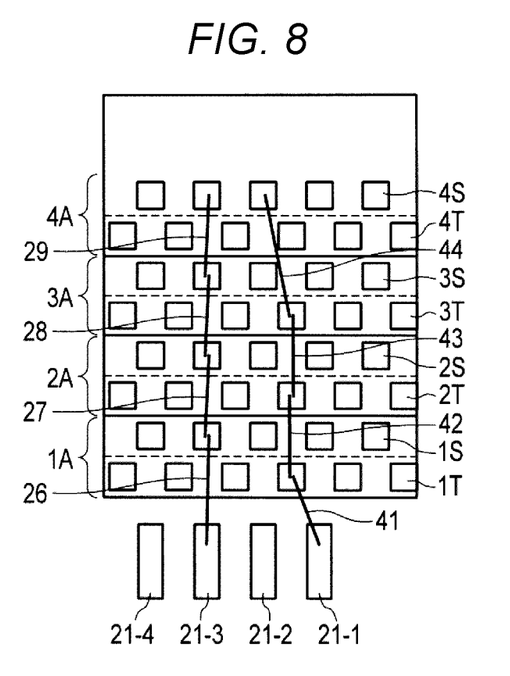
FIG. 8 is an enlarged diagram of a terminal section of a semiconductor chip according to a second embodiment.

A configuration of pads of a semiconductor chip will be described with reference to FIG. 8. FIG. 4 illustrates an enlarged diagram of a portion of a pad area of and lead terminals the semiconductor chips 11_1 to 11_4.

Pads (hereinafter, TEG pads) 1T of a TEG element are arranged in a column on an end portion side of the semiconductor chip 11_1. The TEG pads 1T are arranged in a scribe area 31, and are electrically connected to the TEG element.

In the same manner, TEG pads 2T are arranged in a column on an end portion side of the semiconductor chip 11_2. The TEG pads 2T are arranged in a scribe area 31, and are electrically connected to the TEG element.

TEG pads 3T are arranged in a column on an end portion side of the semiconductor chip 11_3. The TEG pads 3T are arranged in a scribe area 31, and are electrically connected to the TEG element.

TEG pads 4T are arranged in a column on an end portion side of the semiconductor chip 11_4. The TEG pads 4T are arranged in a scribe area 31, and are electrically connected to the TEG element.

2.2 Connection between Pads of Semiconductor Chip and Lead Terminal

Connections made by wires between pads of the semiconductor chip 11_and lead terminals will be described with reference to FIG. 8.

An example in which a wire is connected between a lead terminal 21_1 and a signal pad 4S will be described. A wire 41 is bonded to, and between, the lead terminal 21_1 and the TEG pad 1T, and the lead terminal 21_1 is electrically connected to the TEG pad 1T. Furthermore, a wire 42 is bonded to, and between, the TEG pad 1T and a TEG pad 2T, and the TEG pad 1T is electrically connected to the TEG pad 2T. A wire 43 is bonded to, and between, the TEG pad 2T and a TEG pad 3T, and the TEG pad 2T is electrically connected to the TEG pad 3T. Furthermore, a wire 44 is bonded to, and between, the TEG pad 3T and the signal pad 4S, and the TEG pad 3T is electrically connected to the signal pad 4S.

For example, the chip enable signal CE4 which is output from the controller 12 is supplied to the lead terminal 21_1. The chip enable signal CE4 is transferred to the signal pad 4S from the lead terminal 21_1 through the wire 41, the TEG pad 1T, the wire 42, the TEG pad 2T, the wire 43, the TEG pad 3T, and the wire 44.

Here, the wires are connected to the signal pad 4S from the lead terminal 21_1 through the TEG pads 1T, 2T, and 3T. That is, in order to connect a wire between the lead terminal 21_1 and the signal pad 4S, the TEG pads 1T, 2T, and 3T are used as relay pads for connections made by wires. As a result, it is possible to reduce a length of each of the wires 41 to 44, compared to a case in which the lead terminal 21_1 is directly connected to the signal pad 4S by a wire. As a result, it is possible to reduce abnormality in which a wire is deformed due to moving to the left and right, or a wire is disconnected from a lead terminal or a pad.

2.3 Effects of Second Embodiment

According to the second embodiment, it is possible to use pads of a TEG element which are arranged in a scribe area of a semiconductor chip as relay pads for connecting bonding wires. In this case, it is possible to reduce a size of the scribe area and to ensure relay pads, even if dummy pads are with difficulty arranged in the scribe area.

Specifically, when a wire is connected to a pad of a connection target, the wire is not directly connected to the pad of the connection target from a lead terminal of a package substrate, the wire is first connected to the TEG pad from the lead terminal, and next, the wire is connected to the pad of the connection target from the TEG pad. A connection between the lead terminal and the pad of the connection target may be made through multiple TEG pads. As a result, it is possible to prevent the bonding wire from being lengthened, and to reduce abnormalities in which a wire is deformed due to moving to the left and right when sealing with a resin, or a wire is disconnected from a lead terminal or a pad.

Furthermore, it is possible to prevent a size of an area in which signal pads are arranged from increasing, by using the TEG pads arranged in the scribe area as relay pads. As a result, it is possible to prevent a size of a semiconductor chip and a semiconductor device from increasing.

Modification Example or the Like

The first and second embodiments can be applied to, for example, various semiconductor devices which transmit signals from a controller to multiple semiconductor chips, regardless of a non-volatile memory (for example, NAND flash memory), a volatile memory, a system LSI, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device comprising:
   a first terminal;
   a second terminal;
   a first semiconductor chip on a first substrate, the first substrate having a scribe area thereon around the first semiconductor chip;
   a second semiconductor chip on a second substrate, the second substrate being on the first semiconductor chip and having a scribe area thereon around the second semiconductor chip;
   a first pad located in the scribe area of the first substrate and not on the first semiconductor chip, and electrically disconnected from a semiconductor circuit of the first semiconductor chip;
   a second pad located on the second semiconductor chip and electrically connected with a semiconductor circuit of the second semiconductor chip;
   a third pad located on the first semiconductor chip, and electrically connected with the semiconductor circuit of the first semiconductor chip;
   a fourth pad located in the scribe area of the second substrate and not on the second semiconductor chip, and electrically disconnected from the semiconductor circuit of the second semiconductor chip;
a first wire electrically connecting the first terminal to the first pad;
a second wire electrically connecting the first pad to the fourth pad;
a third wire electrically connecting the second terminal to the third pad; and
a fourth wire electrically connecting the third pad to the second pad.

2. The device according to claim 1, wherein the first pad is located between the first terminal and the third pad.

3. The device according to claim 1, wherein the fourth pad is located between the second terminal and the second pad.

4. The device according to claim 1, wherein
a chip enable signal is transferred from the first terminal to a fifth pad electrically connected to a semiconductor circuit of a third semiconductor chip through the first wire, the first pad, the second wire, and the fourth pad.

5. The device of claim 1, wherein the first and second semiconductor chips are rectangular in shape and have a long edge and a short edge,
the first pad located on the first substrate is located adjacent to the short edge of the first semiconductor chip, and
the second pad located on the second semiconductor chip is located adjacent to the long edge of the second semiconductor chip.

6. The device of claim 5, wherein the second substrate extends outwardly from an edge of the first substrate adjacent to the long edge of the first semiconductor chip.

7. The device according to claim 1, wherein the first pad is closer to an edge of the first substrate than the third pad, and the fourth pad is closer to an edge of the second substrate than the second pad.

8. A semiconductor device comprising:
a first terminal;
a second terminal;
a first semiconductor chip on a first substrate, the first substrate having a scribe area thereon around the first semiconductor chip;
a second semiconductor chip on a second substrate, the second substrate being on the first semiconductor chip and having a scribe area thereon around the second semiconductor chip;
a first pad located in the scribe area of the first substrate and not on the first semiconductor chip, and electrically connected to a test element;
a second pad located on the second semiconductor chip and electrically connected to a semiconductor circuit of the second semiconductor chip;
a third pad located on the first semiconductor chip, and electrically connected with the semiconductor circuit of the first semiconductor chip;
a fourth pad located in the scribe area of the second substrate and not on the second semiconductor chip, and electrically disconnected from the semiconductor circuit of the second semiconductor chip;
a first wire electrically connecting the first terminal to the first pad;
a second wire electrically connecting the first pad to the fourth pad;
a third wire electrically connecting the second terminal to the third pad; and
a fourth wire electrically connecting the third pad to the second pad.

9. The device according to claim 8, wherein the first pad is located between the first terminal and the third pad.

10. The device according to claim 8, wherein the fourth pad is located between the second terminal and the second pad.

11. The device according to claim 8, wherein
a chip enable signal is transferred from the first terminal to a fifth pad electrically connected to a semiconductor circuit of a third semiconductor chip through the first wire, the first pad, the second wire, and the fourth pad.

12. The device of claim 8, wherein the first and second semiconductor chips are rectangular in shape and have a long edge and a short edge,
the first pad located on the first substrate is located adjacent to the short edge of the first semiconductor chip, and
the second pad located on the second semiconductor chip is located adjacent to the long edge of the second substrate.

13. The device of claim 12, wherein the second substrate extends outwardly from an edge of the first substrate adjacent to the long edge of the first semiconductor chip.

14. The device according to claim 8, wherein the first pad is closer to an edge of the first substrate than the third pad, and the fourth pad is closer to an edge of the second substrate than the second pad.

* * * * *